(12) United States Patent
Jang et al.

(10) Patent No.: US 8,252,631 B1
(45) Date of Patent: Aug. 28, 2012

(54) METHOD AND APPARATUS FOR INTEGRATED CIRCUIT PACKAGES USING MATERIALS WITH LOW MELTING POINT

(75) Inventors: Jin-Wook Jang, Scottsdale, AZ (US); Shun Meen Kuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/096,269

(22) Filed: Apr. 28, 2011

(51) Int. Cl.
*H01L 21/44* (2006.01)
*H01L 23/48* (2006.01)

(52) U.S. Cl. ........ 438/118; 438/124; 438/127; 257/783; 257/787; 257/784; 257/666

(58) Field of Classification Search .................. 438/118, 438/124, 127; 257/783, 784, 787, E21.502, 257/E23.116
See application file for complete search history.

(56) References Cited

U.S. PATENT DOCUMENTS

| 6,040,633 | A * | 3/2000 | Manteghi ...................... 257/784 |
| 6,580,170 | B2 * | 6/2003 | Swanson et al. ............... 257/753 |
| 7,682,877 | B2 * | 3/2010 | Joshi et al. .................... 438/123 |
| 7,690,551 | B2 * | 4/2010 | You Yang ...................... 228/56.3 |
| 2003/0071362 | A1 * | 4/2003 | Derderian ...................... 257/777 |
| 2006/0125062 | A1 * | 6/2006 | Zuniga-Ortiz et al. ........ 257/666 |
| 2007/0200258 | A1 * | 8/2007 | Mahler et al. .................. 257/787 |
| 2007/0290369 | A1 * | 12/2007 | Hasegawa et al. ............. 257/783 |
| 2009/0197375 | A1 * | 8/2009 | Kajiwara et al. .............. 438/127 |

* cited by examiner

*Primary Examiner* — Nitin Parekh
(74) *Attorney, Agent, or Firm* — Mary Jo Bertani

(57) ABSTRACT

A method and device are disclosed in which a a lead-free or low-lead die attach material is applied to a surface. An electronic die is positioned on the die attach material. An oxide of at least a specified thickness is formed over an exposed portion of the die attach material. Wire bonds are formed between the electronic die and the surface, and an encapsulant material is applied over the surface, the oxide, and the electronic die.

16 Claims, 3 Drawing Sheets

METHOD AND APPARATUS FOR INTEGRATED CIRCUIT PACKAGES USING MATERIALS WITH LOW MELTING POINT

BACKGROUND

1. Field

This disclosure relates generally to integrated circuit packages, and more specifically, to integrated circuit packages that use die attachment material with little or no lead.

2. Related Art

In recent years, regulations are being enacted that require manufacturers to limit or eliminate materials that may pose health and/or environmental threats. One such case are regulations enacted by the European Union that require manufacturers to restrict materials such as lead, mercury, cadmium, and hexavalent chromium in products such as integrated circuit packages. Although the materials may be used if the components can be re-used, recycled, or otherwise recovered to reduce the disposal of the materials, some manufacturers are seeking ways to eliminate use of the materials altogether.

In the semiconductor industry, integrated circuit dies are attached to a structure using a die attach material and encapsulated in a protective package. Die attach solder materials that have little or no lead content have a lower melting point than die attach materials containing lead. The melting point of low or no lead die attach materials is often less than the temperature used to reflow encapsulation material used to package semiconductor devices.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Methods and devices disclosed herein include a layer of oxide formed on the exposed portions of a die attach material around an electronic die. The oxide helps prevent the die attach material from flowing into delaminated areas between encapsulation material and a surface to which the die is attached when the temperature(s) used during subsequent processing exceeds the melting point of the die attach material. The concept of forming an oxide around a material can be used in any situation where it is desirable to prevent the material from moving from a desired location during processing at temperatures above the melting point of the material.

Figure 1:
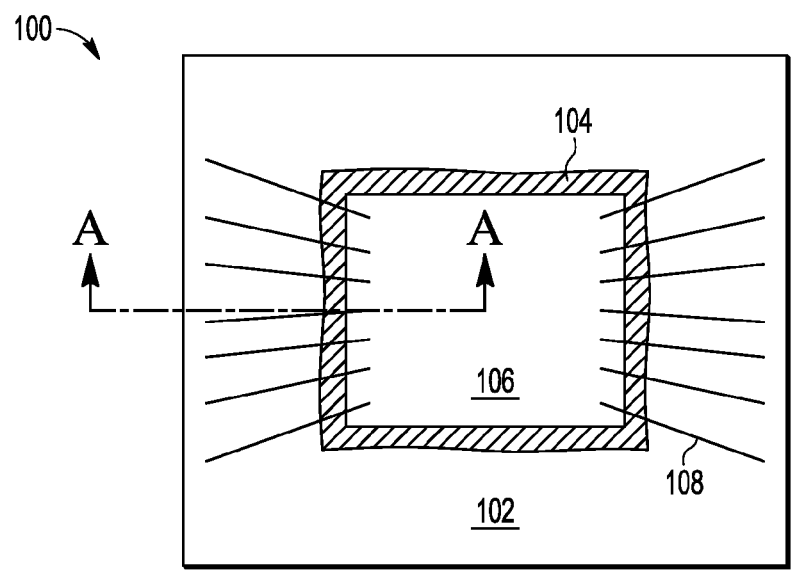
FIG. 1 is a top view of an embodiment of a semiconductor device in one stage of fabrication.

FIG. 1 is a top view of an embodiment of a semiconductor device 100 in one stage of fabrication including a leadframe 102, and die attach material 104 applied on a central surface of leadframe 102 under and around the edges of electronic die 106. Leadframe 102 provides structural support to die 106 during assembly into a finished product. Leadframe 102 includes a die paddle to which die 106 is attached, and conductive leads that provide external electrical connection to components outside the package. Wirebonds 108 are formed between die 106 and the leads of leadframe 102.

Die attach material 104 is a die attach adhesive that provides low moisture absorption and thermal dissipation. Die attach material 104 has conductive properties and can provide good adhesion between die 106 and leadframe 102. Some example die attach materials 104 are Ag based epoxy, Sn—Pb based solder and Au based solder. The die attach material 104 may be filled with particles to increase thermal dissipation properties.

Note that a sufficient quantity of die attach material 104 is usually applied so that a portion of die attach material 104 is exposed around the periphery of die 106. The additional die attach material 104 provides structural support for die 106 as well as dissipating greater quantities of heat when die 106 is operating.

After die 106 is attached, die attach material 104 is cured at an appropriate temperature. Integrated circuit die 106 may be of a type known to those of skill in the art, such as a circuit formed on and cut from a silicon wafer. Typical die sizes may range from 4×4 millimeters (mm) to 12×12 mm. Die 106 may have a thickness ranging from about 70 micrometer (um) to about 650 um. Other suitable dimensions can be used.

Figure 2:
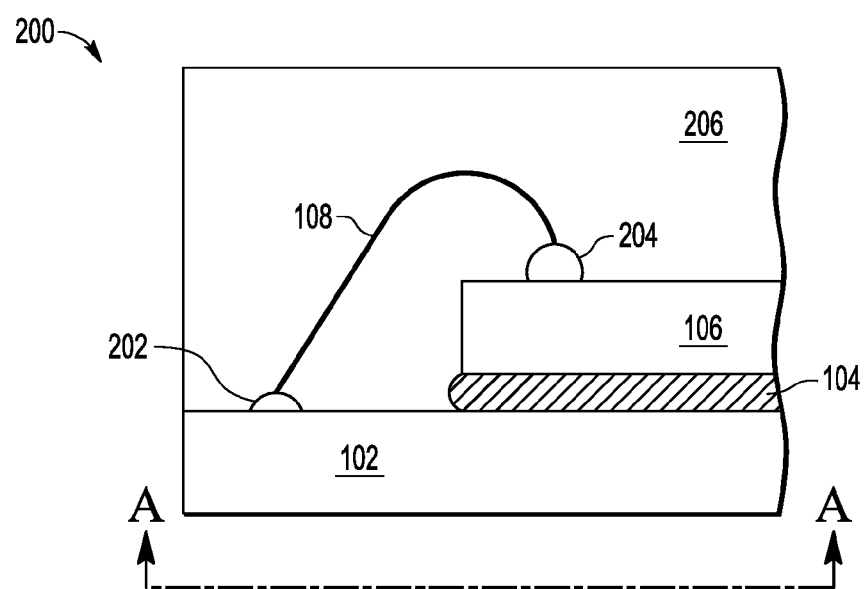
FIG. 2 is a side cross-sectional view of an example of a packaged semiconductor device.

FIG. 2 is a side cross-sectional view of an example of a packaged semiconductor device 200 including die 106 attached to leadframe 102 with die attach material 104. Wirebonds 108 are attached between bond pads 202 on a surface of leadframe 102 and bondpads 204 on a surface of die 106. Encapsulating material 206 is formed over the top surface of leadframe 102, an exposed portion of die attach material 104 around the periphery of die 106, and the top and side surfaces of die 106.

Reflow soldering is a common process for attaching a surface mounted component such as packaged semiconductor device 200 to a circuit board. During reflow soldering, semiconductor device 200 can be subjected to elevated temperatures of up to, for example, 260 degrees C. Temperature variations, such as those encountered during a reflow process, may cause the package to be stressed. The stress is due to differences in thermal expansion and other material properties of the dissimilar materials (e.g. die attach material 104, encapsulating material 206, etc.) used in packaging of the integrated circuit. This stress can result in delamination of leadframe 102 from encapsulating material 206.

Figure 3:
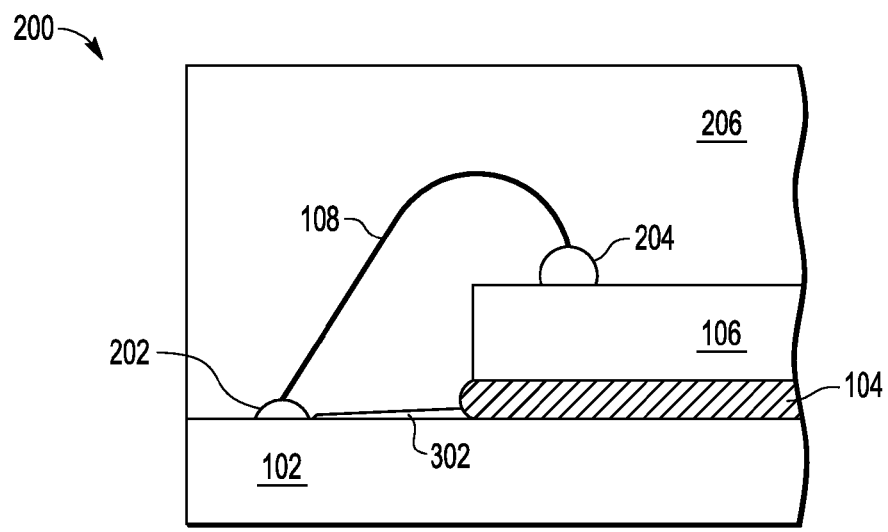
FIG. 3 is a side cross-sectional view of the packaged semiconductor device of FIG. 2 showing delamination between a surface and an encapsulant that can occur when the encapsulant is heated to reflow temperature.

FIG. 3 is a side cross-sectional view of packaged semiconductor device 200 of FIG. 2 showing delamination area 302 between the top surface of leadframe 102 and encapsulating material 206 that can occur when packaged semiconductor device 200 is subject to reflow temperatures when semiconductor device 200 is mounted on a circuit board. Delamination can also occur during other high temperature conditions, whether the high temperatures are experienced during processing/manufacture or operation.

Figure 4:
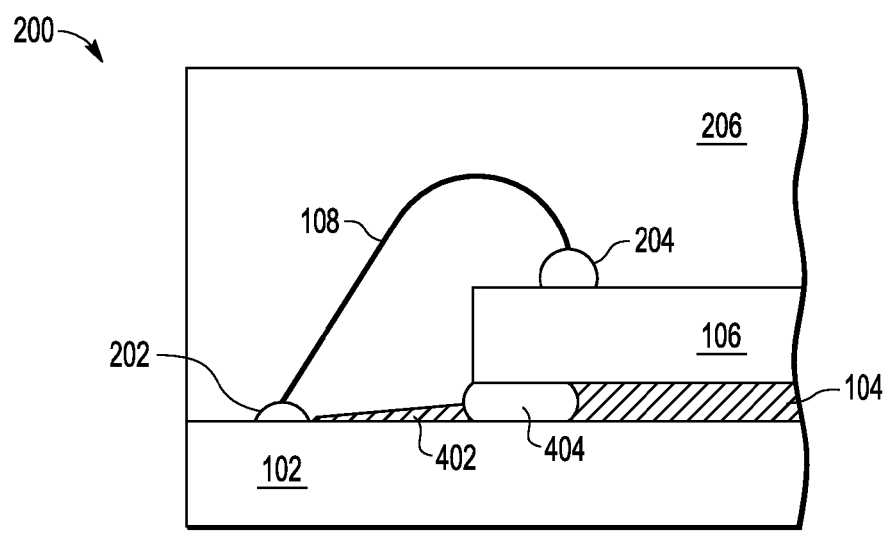
FIG. 4 is a side cross-sectional view of the packaged semiconductor device of FIG. 3 showing a void created under an electronic die when a die attach material melts into the delamination.

FIG. 4 is a side cross-sectional view of packaged semiconductor device 200 of FIG. 3 showing a void 404 created under an electronic die when a portion 402 of die attach material 104 melts into delamination area 302 (FIG. 3) when the processing temperature exceeds the melting temperature of die attach material 104. Void 404 may be caused by a wicking or capillary action of liquified die attach material 104 into delaminated area 302. Void 404 left under die 106 reduces the mechanical stability of the die attachment and may degrade thermal performance of die 106 due to less heat sink area provided by die attachment material 104.

Figure 5:
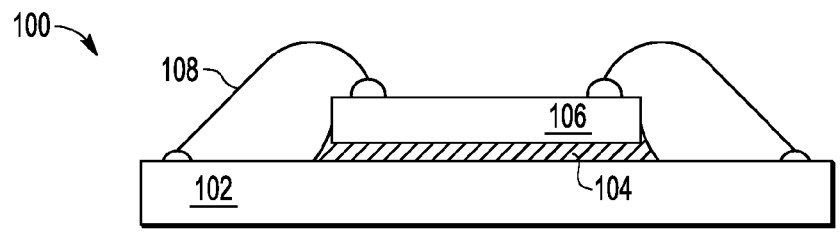
FIG. 5 is a side cross-sectional view of the semiconductor device of FIG. 1.

FIG. 5 is a side cross-sectional view of semiconductor device 100 of FIG. 1 before an oxide layer is formed on the exposed areas of die attach material 104.

Figure 6:
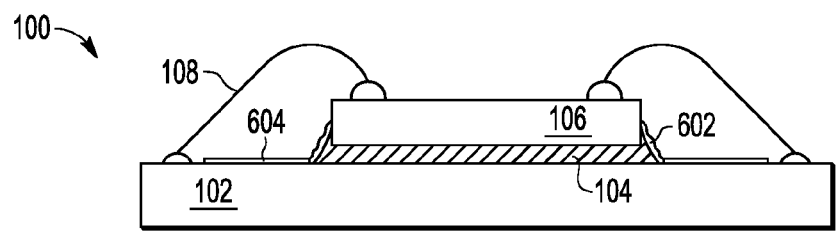
FIG. 6 is a side cross-sectional view of the semiconductor device of FIG. 5 after another stage of processing.

FIG. 6 is a side cross-sectional view of the semiconductor device 100 of FIG. 5 after another stage of processing in which semiconductor device 100 is exposed to specified temperatures for a specified duration to form oxide layer 602 having a desired thickness. A combination of pressure, temperature, and duration is chosen for the annealing process based on the substance or combination of substances used in die attach material 104 to form the desired thickness of oxide 602 over the exposed surfaces of die attach material 104. In some embodiments, die attach material 104 includes tin (Sn), which oxidizes relatively slowly at temperatures below melting point of 232 degrees C. Accordingly, a temperature can be used that is higher than melting point of tin, but low enough to prevent the tin from becoming too liquid and deforming before oxide 602 is formed.

Die attach material 104 can be annealed at a pressure ranging between 0.00001 and 0.21 atmosphere. Other suitable pressures can be used, however.

In some embodiments, die attach material 104 is an alloy comprising tin (Sn), Silver (Ag), and copper (Cu) and the desired thickness of oxide 602 is at least 50 nanometers. Typical alloy composition is $Sn_{(100-x-y)}Ag_xCu_y$, where x=0 to 5 wt % and y=0 to 3 wt %). Die attach material 104 may include little or no lead, for example, less than 10% lead by weight.

As an example, to achieve oxide 602 with a thickness of at least 50 nm on die attach material 104 with tin and little or no lead, a temperature ranging between 150 and 300 degrees Centigrade for a duration of 30 seconds to 30 minutes can be used during the annealing process. The lower the temperature, the greater the amount of time may be required to achieve the desired thickness of oxide 602.

As another example, when leadframe 102 is made of copper, copper oxide 604 may form on the exposed copper surface. If oxide 604 is too thick, oxide 604 may prevent encapsulating material 206 from adhering to leadframe 102. To achieve the desired thickness of oxide 602 (e.g., at least 50 nm) while preventing oxide 604 from getting too thick, the annealing process can be conducted at a temperature in a range between 200 and 300 degrees Centigrade for a duration between 30 seconds and 5 minutes at an oxygen partial pressure ranging between 0.10 and 0.30 atmosphere. As a more specific example, an annealing process at 250 degrees C. for 5 minutes at standard atmospheric pressure forms oxide 602 with thickness of 50 nm and copper oxide 604 with thickness of 50-100 nm.

As a further example, when leadframe 102 has a pre-plated surface (e.g., nickel-palladium-gold) that does not oxidize, die attach material 104 can be annealed at a temperature in a range between 200 and 300 degrees Centigrade for a duration between 30 seconds and 30 minutes at an oxygen partial pressure ranging between 0.10 and 0.30 atmosphere.

Figure 7:
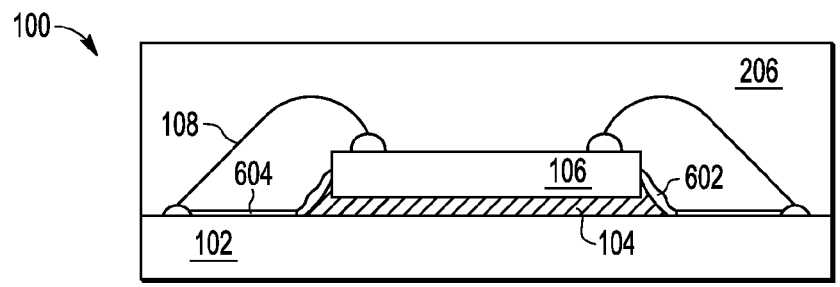
FIG. 7 is a side cross-sectional view of the semiconductor device of FIG. 6 after another stage of processing.

FIG. 7 is a side cross-sectional view of the semiconductor device 100 of FIG. 6 after another stage of processing in which encapsulating material 206 is molded over leadframe 102, die attach material 104, oxides 602, 604, die 106, wirebonds 108, and any other components that may be included in semiconductor device 100 but are not shown in FIG. 7. The encapsulation process is typically not performed at temperatures that would cause delamination between leadframe 102 and encapsulating material 206.

Figure 8:
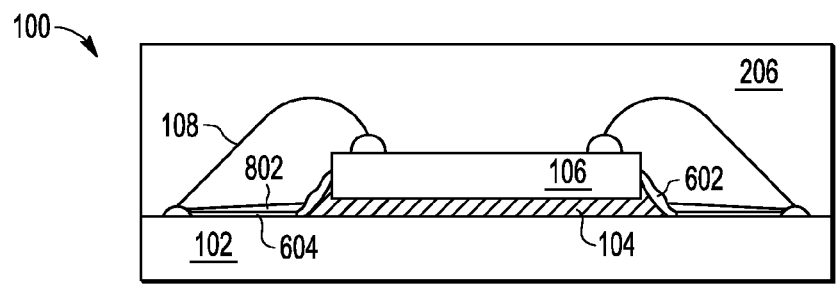
FIG. 8 is a side cross-sectional view of the semiconductor device of FIG. 7 after another stage of processing.

FIG. 8 is a side cross-sectional view of the semiconductor device of FIG. 7 after another stage of processing in which semiconductor device 100 is attached to a circuit board or other component (not shown) using a reflow process at temperatures greater than the melting point of die attach material 104. Although delamination 802 can occur over copper oxide 604, note that oxide 602 around die attach material 104 prevents die attach material 104 from flowing into the delaminated spaces between copper oxide 604 and encapsulating material 206.

The semiconductor substrate described herein can be any semiconductor material or combinations of materials, such as gallium arsenide, silicon germanium, silicon-on-insulator (SOI), silicon, monocrystalline silicon, the like, and combinations of the above.

By now it should be appreciated that there has been provided methods and devices to provide a packaged semiconductor device 100 that can use die attach material 104 with little or no lead content while avoiding problems associated with the die attach material melting out from under at least a portion of the edges around an electronic die 106 at reflow temperatures.

In some embodiments, a method comprises applying a die attach material 104 to a surface 102, positioning an electronic die 106 on the die attach material 104, annealing the die attach material 104 to form an oxide 602 of at least a specified thickness over an exposed portion of the die attach material 104, applying an encapsulant material 206 over the surface 102, the oxide 602, and the electronic die 106, wherein the oxide prevents the die attach material from wicking into a delamination void between the surface and encapsulant material at temperatures greater than the melting point of the die attach material.

In some aspects, the die attach material includes tin (Sn).

In further aspects, the die attach material is annealed at a temperature in a range between 150 and 300 degrees Centigrade for a duration between 30 seconds and 30 minutes.

In still further aspects, the thickness of the oxide is at least 50 nanometers.

In still further aspects, the die attach material is annealed at a temperature greater than 232 degrees Centigrade.

In still further aspects, the die attach material is annealed at an oxygen partial pressure ranging between 0.00001 and 0.21 atmosphere.

In still further aspects, the surface is a copper leadframe and the die attach material is annealed at a temperature in a range between 200 and 300 degrees Centigrade for a duration between 30 seconds and 5 minutes.

In still further aspects, the surface is a copper leadframe and the die attach material is annealed at a temperature in a range between 200 and 300 degrees Centigrade for a duration between 30 seconds and 5 minutes at an oxygen partial pressure ranging between 0.10 and 0.30 atmosphere.

In still further aspects, the surface is a pre-plated leadframe and the die attach material is annealed at a temperature in a range between 200 and 300 degrees Centigrade for a duration between 30 seconds and 30 minutes at an oxygen partial pressure ranging between 0.10 and 0.30 atmosphere.

In still further aspects, the method further comprises forming wire bonds between the electronic die and the surface.

In still further aspects, the die attach material includes less than 10% lead by weight.

In another embodiment, a packaged semiconductor device comprises a die attach material applied to a surface, an electronic die positioned on the die attach material, an oxide formed over an exposed portion of the die attach material, and an encapsulant material applied and cured over the surface, the oxide, and the electronic die.

In some aspects, the die attach material includes tin (Sn).

In further aspects, the thickness of the oxide is at least 40 nanometers.

In still further aspects, the device further comprises wire bonds formed between the electronic die and the surface.

In still further aspects, the die attach material includes less than 10% lead by weight.

In another embodiment, a method comprises applying a a lead-free or low-lead die attach material to a surface, positioning an electronic die on the die attach material, forming an oxide of at least a specified thickness over an exposed portion of the die attach material, forming wire bonds between the electronic die and the surface, and applying an encapsulant material over the surface, the oxide, and the electronic die.

In some aspects, the thickness of the oxide is at least 50 nanometers.

In further aspects, the surface is at least one of the group consisting of: a copper leadframe and a pre-plated leadframe.

In still further aspects, the oxide is formed at a temperature in a range between 200 and 300 degrees Centigrade for a duration between 30 seconds and 5 minutes at an oxygen partial pressure ranging between 0.10 and 0.30 atmosphere.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
   applying a lead-free die attach material to a surface on a leadframe;
   positioning an electronic die on the die attach material;
   annealing the die attach material to form an oxide of at least a specified thickness over an exposed portion of the die attach material; and
   applying an encapsulant material over the surface, the oxide, and the electronic die, wherein the oxide prevents the die attach material from wicking into a delamination void between the leadframe surface and the encapsulant material, wherein the die attach material is annealed at a temperature in a range between 150 and 300 degrees Centigrade for a duration between 30 seconds and 30 minutes in presence of an oxygen atmosphere.

2. The method of claim 1 wherein the die attach material includes tin (Sn).

3. The method of claim 1 wherein the thickness of the oxide is at least 50 nanometers.

4. The method of claim 1 wherein the die attach material is annealed at a temperature greater than 232 degrees Centigrade.

5. The method of claim 1 wherein the die attach material is annealed at an oxygen partial pressure ranging between 0.00001 and 0.21 atmosphere.

6. The method of claim 1 wherein the surface is a copper leadframe and the die attach material is annealed at a temperature in a range between 200 and 300 degrees Centigrade for a duration between 30 seconds and 5 minutes.

7. The method of claim 1 wherein the surface is a copper leadframe and the die attach material is annealed at a temperature in a range between 200 and 300 degrees Centigrade for a duration between 30 seconds and 5 minutes at an oxygen partial pressure ranging between 0.10 and 0.30 atmosphere.

8. The method of claim 1 wherein the surface is a pre-plated leadframe and the die attach material is annealed at a temperature in a range between 200 and 300 degrees Centigrade for a duration between 30 seconds and 30 minutes at an oxygen partial pressure ranging between 0.10 and 0.30 atmosphere.

9. The method of claim 1 further comprising forming wire bonds between the electronic die and the surface.

10. The method of claim 1 wherein the die attach material includes less than 10% lead by weight.

11. A packaged semiconductor device comprising:
    a die attach material having less than 10 wt. % lead applied to a surface on a copper leadframe;
    an electronic die positioned on the die attach material;
    an oxide formed over an exposed portion of the die attach material; and
    an encapsulant material applied over the surface, the oxide, and the electronic die, wherein the oxide is formed by annealing the die attach material in an oxygen atmosphere at a range between 150 and 300 degrees Centigrade for a duration between 30 seconds and 30 minutes to form the oxide thickness of at least 40 nanometers.

12. The device of claim 11 wherein the die attach material includes tin (Sn).

13. The device of claim 11 further comprising wire bonds formed between the electronic die and the surface.

14. A method comprising:
applying a lead-free die attach material to a surface;
positioning an electronic die on the die attach material;
forming an oxide of at least a specified thickness over an exposed portion of the die attach material;
forming wire bonds between the electronic die and the surface; and
applying an encapsulant material over the surface, the oxide, and the electronic die, wherein the die attach material is annealed at a temperature in a range between 150 and 300 degrees Centigrade for a duration between 30 seconds and 30 minutes in presence of an oxygen atmosphere to form the oxide.

15. The method of claim 14 wherein the thickness of the oxide is at least 50 nanometers.

16. The method of claim 14 wherein the surface is at least one of the group consisting of: a copper leadframe and a pre-plated leadframe.

* * * * *